(12) United States Patent
Jin et al.

(10) Patent No.: US 10,204,816 B2
(45) Date of Patent: Feb. 12, 2019

(54) SUBSTRATE RETAINING CARRIER, METHOD FOR RETAINING AND SEPARATING SUBSTRATE AND METHOD FOR EVAPORATION

(71) Applicants: BOE Technology Group Co., Ltd., Beijing (CN); HEFEI Xinsheng Optoelectronics Technology Co., Ltd., Hefei (CN)

(72) Inventors: Xuequan Jin, Beijing (CN); Chia Hao Chang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 69 days.

(21) Appl. No.: 15/279,872

(22) Filed: Sep. 29, 2016

(65) Prior Publication Data

US 2017/0125278 A1    May 4, 2017

(30) Foreign Application Priority Data

Oct. 30, 2015    (CN) .......................... 2015 1 0729440

(51) Int. Cl.
*H01L 21/683*   (2006.01)
*H01L 21/687*   (2006.01)
(Continued)

(52) U.S. Cl.
CPC .... *H01L 21/6838* (2013.01); *H01L 21/68742* (2013.01); *H01L 21/68785* (2013.01);
(Continued)

(58) Field of Classification Search
CPC ................. B25B 11/00; H01L 21/6838; H01L 21/68785; H01L 21/68742; H01L 51/56;
(Continued)

(56) References Cited

U.S. PATENT DOCUMENTS 6,182,956 B1 * 2/2001 McMillan ............. B25B 11/005
269/21
6,887,317 B2 * 5/2005 Or ....................... C23C 16/4401
118/500

(Continued)

FOREIGN PATENT DOCUMENTS

CN        203807547 U     9/2014
KR     20120106095 A     9/2012
(Continued)

OTHER PUBLICATIONS

Apr. 25, 2017—(CN) First Office Action Appn 201510729440.5 with English Tran.

*Primary Examiner* — David Bryant
*Assistant Examiner* — Nirvana Deonauth
(74) *Attorney, Agent, or Firm* — Banner & Witcoff, Ltd.

(57) ABSTRACT

A substrate retaining carrier, a method for retaining and separating the substrate, and a method for evaporation are provided. The substrate retaining carrier includes a substrate stage and a movable substrate retaining support device, the substrate retaining support device comprises multiple probes and a probe holder, wherein a first end of each of the probes is provided with a substrate retaining member, and a second end of each of the probes is secured onto the probe holder; the substrate stage is provided with through holes for passage of the probes therein.

11 Claims, 4 Drawing Sheets

(51) Int. Cl.
*H01L 51/00* (2006.01)
*H01L 51/56* (2006.01)
*H01L 27/32* (2006.01)

(52) U.S. Cl.
CPC .......... *H01L 51/0008* (2013.01); *H01L 51/56* (2013.01); *H01L 27/3244* (2013.01); *H01L 2227/323* (2013.01)

(58) Field of Classification Search
CPC ........... H01L 51/0008; H01L 2227/323; H01L 27/3244
See application file for complete search history.

(56) References Cited

U.S. PATENT DOCUMENTS

2015/0348823 A1* 12/2015 Chia ................ H01L 21/68742
269/296
2016/0099166 A1* 4/2016 Yudovsky ........... H01L 21/6838
29/559

FOREIGN PATENT DOCUMENTS

| KR | 20130092204 A | 8/2013 |
| KR | 20140021832 A | 2/2014 |

\* cited by examiner

SUBSTRATE RETAINING CARRIER, METHOD FOR RETAINING AND SEPARATING SUBSTRATE AND METHOD FOR EVAPORATION

This application claims priority to and the benefit of Chinese Patent Application No. 201510729440.5 filed on Oct. 30, 2015, which application is incorporated herein in its entirety.

TECHNICAL FIELD

The Present disclosure relates to a substrate retaining carrier, a method for retaining and separating the substrate, and a method for evaporation.

BACKGROUND

AMOLED (active-matrix organic light emitting diode), as a novel type of display device, has characteristics of high chroma, high-contrast, wide viewing angle, high-brightness, self-luminescence, fast response, and enabling flexible display and the like, and has been recognized as the next generation flat panel display technology.

The AMOLED substrate is mainly composed of LTPS (low temperature poly-silicon) and oxide, then is vapor-deposited with organic materials, and finally, a cover plate is used to enclose the devices. However, the production technique for the AMOLED substrate is still a relatively novel technique; there are still many problems to be conquered in the production of large-scale AMOLED screens. In the process of evaporation of organic materials, the large-sized glass substrate needs to be secured onto a glass retaining carrier, is overturned and then is subjected to evaporation, is overturned back after the evaporation technique to separate the glass substrate from the glass retaining carrier.

SUMMARY

An embodiment of the disclosure provides a substrate retaining carrier, comprising: a substrate stage and a movable substrate retaining support device, the substrate retaining support device comprises multiple probes and a probe holder, wherein a first end of each of the probes is provided with a substrate retaining member, and a second end of each of the probes is secured onto the probe holder; the substrate stage is provided with through holes for passage of the probes therein.

In some examples, each of the probes has a height greater than a thickness of the substrate stage.

In some examples, the substrate retaining support device is configured to enable the first end of each of the probes to move into a corresponding through hole and locate between two surfaces of the substrate stage.

In some examples, the substrate retaining support device further comprises a probe support device; the probe support device is configured to support the probes of the substrate retaining support device to reciprocate within the through holes.

In some examples, the probe support device comprises: an elastic part for supporting the probe holder; and a support base for securing the elastic part.

In some examples, the support base and the substrate stage are fixedly connected to each other.

In some examples, the elastic part locates at a side of the probe holder opposite to the probes.

In some examples, the substrate stage comprises a substrate carrying surface, the probe holder and the probe support device are located at a side of the substrate stage opposite to the substrate carrying surface.

In some examples, the elastic part is configured to drive the probe holder so that the probes reciprocate between a first position, at which the first end of each of the probes protrudes from the substrate carrying surface outside of the through hole, and a second position, at which the first end of each of the probes retracts into the through hole.

In some examples, the substrate retaining member comprises an adhesive gasket.

In some examples, the substrate retaining member further comprises a vacuum chuck, and a vacuum piping coupled with the vacuum chuck is further provided inside the probe.

In some examples, the second ends of the multiple probes are evenly secured onto the probe holder.

In some examples, the multiple probes have identical heights.

An embodiment of the disclosure provides a method for retaining and separating substrates, applied to the above mentioned substrate retaining carrier, and comprising: moving the first end of each of the probes to be above a surface of the substrate stage; placing the substrate so that the substrate is secured onto the substrate retaining support device; and moving the first end of each of the probes to be below the surface of the substrate stage, so as to separate the substrate from the substrate retaining support device.

An embodiment of the disclosure provides a method for evaporation using the above mentioned substrate retaining carrier, comprising: moving the first end of each of the probes to be above the surface of the substrate stage; placing the substrate so that the substrate is secured onto the substrate retaining support device; overturning the substrate retaining carrier and coating a film on the substrate; overturning the substrate retaining carrier; and moving the first end of each of the probes to be below the surface of the substrate stage, so as to separate the substrate from the substrate retaining support device.

BRIEF DESCRIPTION OF THE DRAWINGS

In the following, a brief introduction will be made to the drawings of the embodiments of present invention so as to describe the embodiments more clearly, and obviously, the drawings described below only relate to some of the embodiments of the present invention, rather than limitation of the present invention.

DETAILED DESCRIPTION

For the purpose of making the purpose, the technical solution and its advantages of the embodiment of present invention even more clear, a clear and complete description will be made about the technical solution of the embodiment of present invention in conjunction with the drawings of the embodiment of present invention. Apparently, the described embodiments are only part of the embodiments of the present invention, rather than all of the embodiments. Based on the described embodiments of present invention, all the other embodiments obtained by the ordinary skilled person in this art without creative endeavors belong to the protective scope of the present invention.

Figure 1:
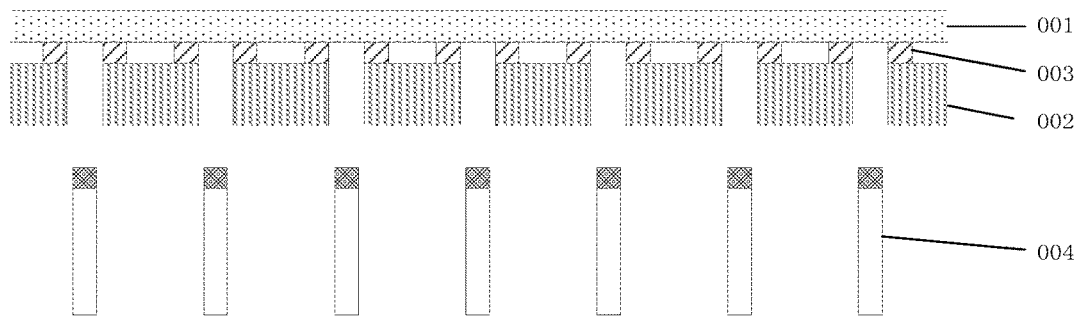
FIG. 1 is a schematic view illustrating separation of the substrate.
Figure 2:
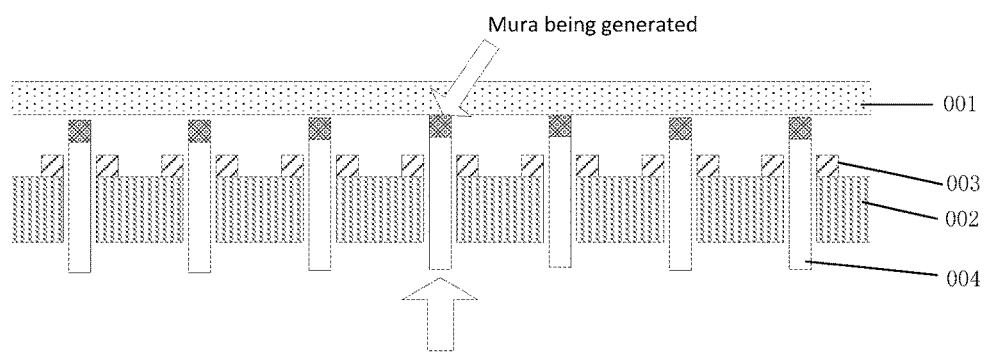
FIG. 2 is a schematic view illustrating unevenness occurred during the separation of the substrate.

FIG. 1 is a schematic view illustrating the separation of the substrate. As illustrated in FIG. 1, in the evaporation technique, the glass substrate 001 is secured in such a way that an adhesive gasket 003 is provided on the substrate stage 002 to adhere the glass substrate 001 onto the adhesive gasket 003 of the substrate stage 002. Upon separating the glass substrate 001, the probes 004 are used mechanically to eject the glass substrate 001 upward so as to separate the glass substrate 001 from the glass retaining carrier. As illustrated in FIG. 2, due to the mutual independence among the probes, there will be uneven heights between these probes 004, thus upon separating the glass substrate 001 adhered onto the substrate stage 002, some higher probes will support the glass substrate with a greater force, while some lower probes will support the substrate with a less force or even have no contact with the glass substrate. Additionally, the contact area between the probe and the glass substrate is less, the probes of different heights apply upward support force against the glass substrate, such that different parts of the substrate would have different rising heights due to uneven heights of the probes, therefore, the glass substrate is likely to occur stress concentration at the location supported by a higher probe, the contact point with the probe produces unevenness, that is, the Mura effect, which depresses the yield rate of the AMOLED product production.

Figure 3:
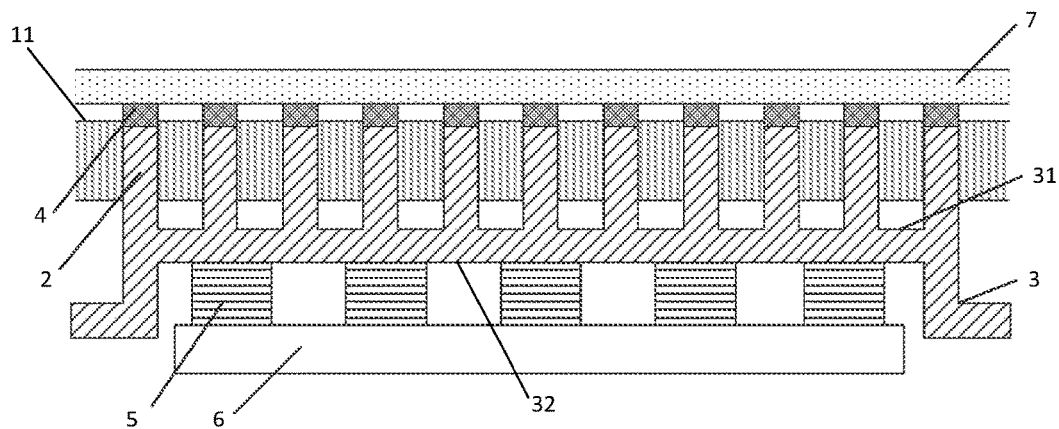
FIG. 3 is a schematic view of a substrate retaining carrier provided by a first embodiment of the present disclosure.

As illustrated in FIG. 3, the present disclosure provides a substrate retaining carrier comprising: a substrate stage 1 and a movable substrate retaining support device provided within the substrate stage 1, the substrate retaining support device comprises multiple probes 2 and a probe holder 3; the first end of the probe 2 is provided with a substrate retaining member 4, the second end of the probe 2 is secured onto the probe holder 3; the substrate stage 1 is provided with through holes 12 (see FIG. 4) for the passage of the probe. A detailed description will be made in the following about the substrate retaining carrier, the method for retaining and separating the substrate and the method for vapor-depositing the substrate provided by the present disclosure.

First Embodiment

Figure 4:
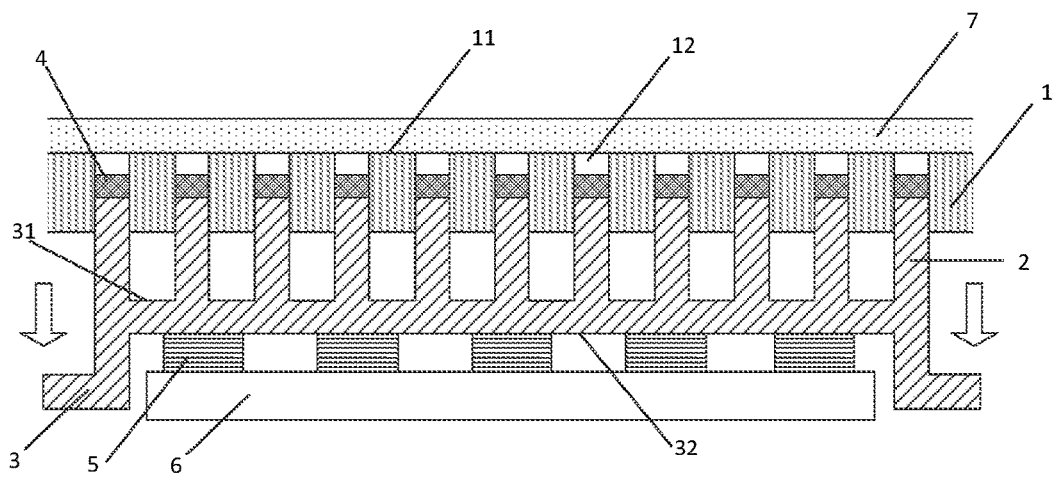
FIG. 4 is a schematic view illustrating the separation of the substrate from the substrate retaining carrier provided by the first embodiment of the present disclosure.

As illustrated in FIGS. 3 and 4, the substrate retaining carrier comprises a substrate stage 1 and a substrate retaining support device. The substrate retaining support device comprises, for example, multiple probes 2 and a probe holder 3. The probe holder 3 further comprises a securing surface 31 onto which the second ends of the multiple probes 2 are secured. The multiple probes 2 have identical heights, so that the first ends of the probes 2 are located in the same plane, and finally, the substrate retaining members 4 are in the same plane. The substrate stage 1 comprises a substrate carrying surface 11 for the placement of the substrate, the substrate carrying surface 11 is provided with through holes 12 correspondingly for the passage of the probes 2.

For example, the multiple probes 2 are of identical heights. The height of a probe means, for example, the length from the first end to the second end of the probe. Additionally, as illustrated in FIGS. 3 and 4, the height of the probe 2 is greater than the thickness of the substrate stage 1, in this way, when the probe holder 3 locates at a side of the substrate stage 1 opposite to the substrate carrying surface 11, the first end of the probe 2 could protrude from the substrate carrying surface 11 out of the through hole, thereby supports the substrate 7.

Figure 5:
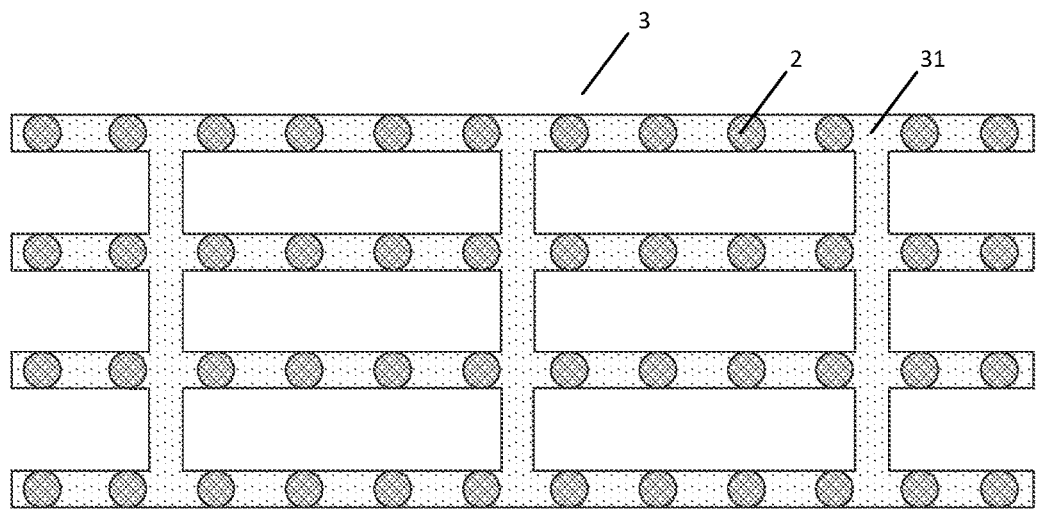
FIG. 5 is a top view of the substrate retaining support device provided by the first embodiment of the present disclosure.

FIG. 5 illustrates an exemplary solution of a probe holder. The probe holder 3 is a network structure constituted by multiple strip mechanisms alternating transversely and longitudinally, and the strip mechanisms are provided with transverse or longitudinal stiffeners therebetween. Absolutely, the probe holder 3 may also be a plane-shaped structure. It is apparent that the network structure, as illustrated in FIG. 5, can save materials in a greater extent with respect to ordinary plane-shaped structure, thus facilitating the depression of the cost for the device.

Figure 6:
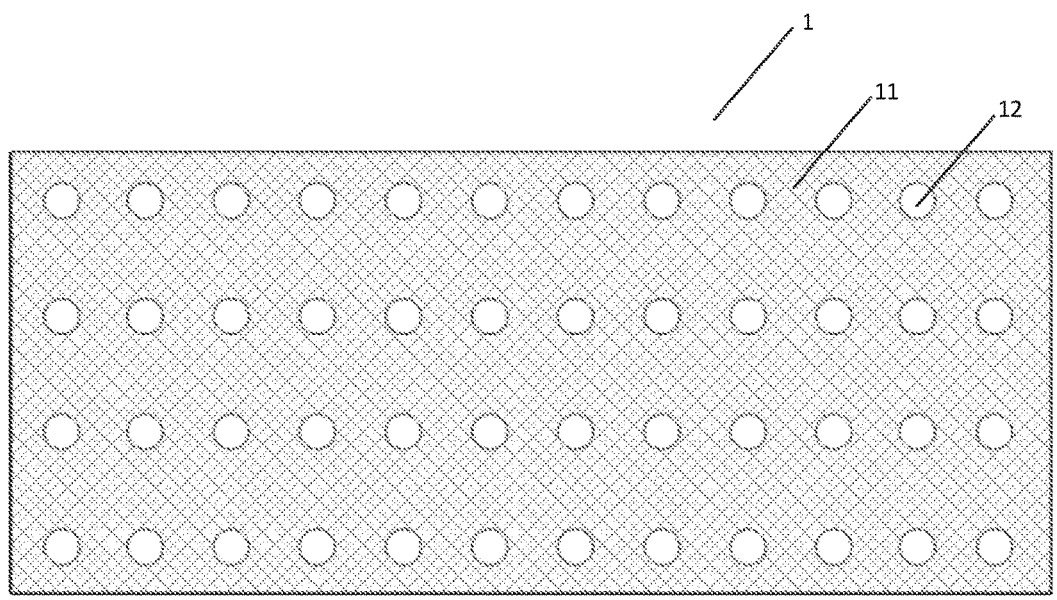
FIG. 6 is a top view of the substrate stage provided by the first embodiment of the present disclosure.

FIG. 5 also illustrates an exemplary solution for the connection of the probes and the probe holder. The cylindrical probes 2 are evenly distributed on the strip mechanisms of the securing surface 31 while being perpendicular to the securing surface 31. And correspondingly, as illustrated in FIG. 6, the circular through holes 12 are also evenly distributed at the substrate carrying surface 11, the axial direction of the through hole 12 is for example orthogonal to the substrate carrying surface 11, and the opening radius of the through hole 12 is slightly greater than the cross sectional radius of the probe 2. It is to be understood that the shape of the probe is not limited to the cylindrical form in this embodiment, but can also be other shapes, for example, prism; the shape of the through hole 12 may be identical to or different from the cross-sectional shape of the probe, so long as the probe is enabled to pass through the through hole, that is, the present disclosure can be achieved.

Furthermore, as illustrated in FIGS. 3 and 4, the substrate retaining carrier further comprises a probe support device for supporting the probe holder 3 to reciprocate. For example, the probe support device comprises elastic parts 5 and a support base 6. The elastic parts 5 are provided between the probe holder 3 and the support base 6. That is to say, the elastic parts locate at a side of the probe holder opposite to the probes. The probe holder further comprises a supporting face 32 arranged opposite to the securing surface 31. The support base 6 is fixedly connected to the substrate stage 1, and the plane where the support base 6 locates is parallel with the substrate carrying surface 11 of the substrate stage 1. One end of the elastic part 5 is secured onto the support base 6, and its other end contacts with the supporting face 32. The extension and contraction direction of the elastic part 5 is perpendicular to the supporting face 32. With the extension and contraction of the elastic part 5, the probes 2 on the probe holder 3 are enabled to reciprocate within the through holes 12 of the substrate stage 1. It should be appreciated that the present disclosure is not limited thereto, other devices capable of making the probes to reciprocate within the through holes 12 may also achieve the present disclosure, such as, the hydraulic device, the pneumatic device, the electromagnetic device and the like.

For example, the substrate stage comprises a substrate carrying surface, and the probe holder and the probe support device are located at a side of the substrate stage opposite to the substrate carrying surface.

For example, the elastic part is configured to drive the probe holder so that the probe reciprocates between a first position, at which the first ends of the probes protrude from the substrate carrying surface outside of the through holes, and a second position, at which the first ends of the probe retract into the through holes.

As illustrated in FIG. 3, when a substrate 8 is to be secured onto the substrate retaining carrier, the substrate stage 1 is secured, the elastic parts 5 support the probe holder 3 against the substrate stage 1, so that part of the substrate retaining member 4 at the first end of the probe 2 protrudes out of the substrate carrying surface 11, other part is still below the substrate carrying surface 11, the substrate 8 placed above the substrate stage 1 is secured onto the substrate retaining member 4.

Figure 7:
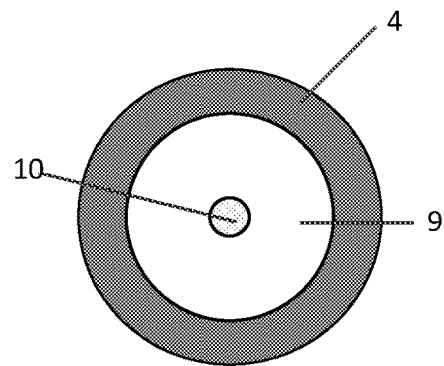
FIG. 7 is a top view of the adhesive gasket and the vacuum chuck provided by the first embodiment of the present disclosure.
Figure 8:
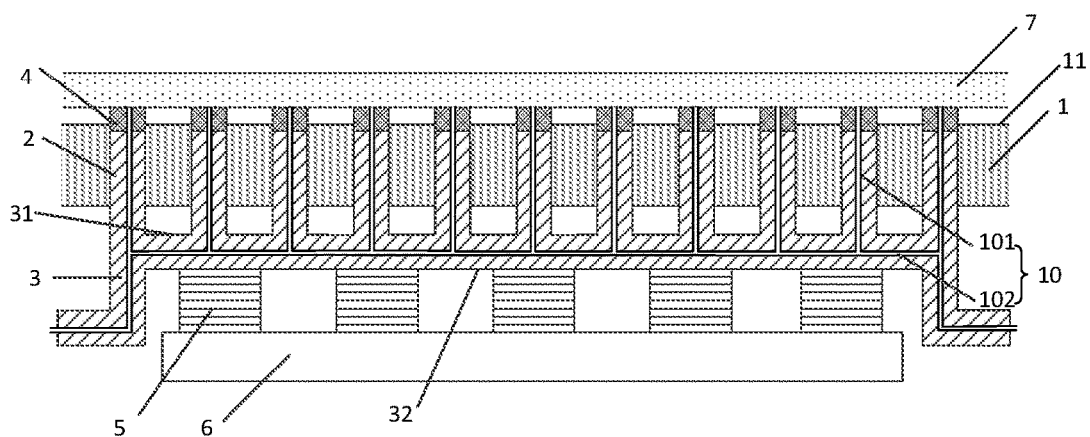
FIG. 8 is a schematic view illustrating the vacuum piping provided by the first embodiment of the present disclosure.

To ensure a stable securing of the substrate 8 onto the substrate retaining member 4, the substrate retaining member 4 comprises an adhesive gasket used to adhesively bond to the substrate 8 when the substrate 8 is to be secured. Furthermore, as illustrated in FIG. 7, the substrate retaining member 4 further comprises for example a vacuum chuck 9, the vacuum chuck 9 is embedded at the centre of the surface of the adhesive gasket 4 while opening toward the direction of the substrate to be secured; and correspondingly, as illustrated in FIG. 8, the interior of the probes 2 and the interior of the probe holder are provided with vacuum piping 10 connected with the vacuum chuck 9. The vacuum piping 101 within the probes 2 communicates with each other through the vacuum piping 102 within the probe holder 3. During the process of evaporation, evacuation is continuously performed by the evacuation device through the vacuum piping 10, so that the vacuum chuck 9 keeps adsorbing the substrate 7 and thus improves the adhering force between the substrate 7 and the adhesive gasket 4, so that the substrate 7 can be even more firmly and adhesively bonded to the adhesive gasket 4.

As illustrated in FIG. 4, when the substrate retaining carrier separates the substrate 7, the substrate 7 and the substrate stage 1 are retained to each other, the probe holder 3 is driven to move in a direction away from the substrate 7 under the action of external force, and presses the elastic parts 5 until the part of the substrate retaining member 4, which has protruded out of part of the substrate carrying surface 11, moves below the substrate carrying surface 11. The substrate 7 and the substrate retaining member 4 separate from the probes 2 under the support of the substrate stage 1. After the separation of the substrate 7, the probe holder 3 restores the condition of pressing against the substrate stage 1 under the support of the elastic parts 5, a part of the substrate retaining member 4 protrudes out of the substrate carrying surface 11 once again, and the substrate retaining member 4 is ready for retaining the next substrate for evaporation.

To be specified, in the process of evaporation, the substrate is required to overturn or move within the evaporation cavity, and accordingly, the device for securing the substrate is also required to be able to support the substrate to overturn or move. Therefore, the substrate retaining carrier provided by this embodiment is movably provided within the evaporation cavity so as to facilitate the performing of the film-plating technology.

Second Embodiment

This embodiment provides a method for retaining and separating the substrate which is applied for the substrate retaining carrier provided in the first embodiment, for example, the method comprises the following steps.

Upon securing the substrate, the probe support device supports the probe holder to move in a direction approaching the substrate stage, till at least a part of the substrate retaining member on the probe protrudes out of the substrate carrying surface; placing the substrate onto the substrate carrying surface and fixedly connecting the substrate with the protruded substrate retaining member. For example, the substrate and the substrate retaining member are secured in an adhesively bonding manner; or while adhesively bonding and securing the same, the substrate is also subjected to vacuum-adsorbing to enhance the adhering capability between the substrate and the substrate retaining member. After securing the substrate, the probe support device is caused to support the probe holder to press against the substrate stage, thus maintaining the substrate retaining member to protrude out of the substrate carrying surface to enable the securing state of the substrate with the substrate retaining member.

Upon separating the substrate, the probe holder is driven to move in a direction away from the substrate, till the substrate retaining member, which has protruded out of the substrate carrying surface, moves below the substrate carrying surface; and under the support of the substrate stage, the substrate separates from the probe. To be specified, given that the manners of adhesively bonding and vacuum adsorbing are used in combination upon securing the substrate, then before pre-separating the substrate, the vacuum adsorbing is firstly stopped to reduce the adhering force of the substrate with the substrate retaining member, then the probe holder is driven away from the substrate, the operation of separating the substrate is performed.

Third Embodiment

This embodiment provides a method for evaporation, which comprises for example: driving the probe holder to move in a direction approaching the substrate stage under the support of the probe support device, till at least a part of the substrate retaining member on the probe protrudes out of the substrate carrying surface; regulating the substrate retaining carrier till the substrate carrying surface faces toward a first direction; placing the substrate onto the substrate carrying surface so that the substrate is secured with the protruded substrate retaining member. After securing the substrate, the probe support device is caused to support the probe holder to press against the substrate stage, thus maintaining the substrate retaining member to protrude out of the substrate carrying surface, to enable the securing state of the substrate with the substrate retaining member in the process of evaporation and thus to prevent the falling off of the substrate; overturning the substrate retaining carrier till the outer surface of the substrate faces toward a second direction, and coating film on the substrate; after the film coating, overturning the substrate retaining carrier till the outer surface of the substrate faces toward the first direction again; driving the probe holder to move in a direction away from the substrate till the substrate retaining member, which has protruded out of the substrate carrying surface, moves below the substrate carrying surface; under the support of the substrate stage, the substrate separates from the probes. After the separation of the substrate, the probe support device is caused to support the probe holder to restore the state of pressing against the substrate stage, so that at least a part of the substrate retaining member protrudes out of the surface of the substrate stage again, and is ready for securing the next substrate to be vapor-deposited; moving the separated substrate out of the evaporation cavity.

It should be understood that the securing of the substrate with the substrate retaining member in this embodiment may also be performed in the adhesively bonding and securing manner or the combination of adhesively bonding and vacuum adsorbing manners, as disclosed in the second embodiment. For the sake of brevity, their detailed description is omitted here.

In summary, with the substrate retaining carrier, the method for retaining and separating the substrate and the method for evaporation, multiple probes of identical heights are used to reciprocate consistently inside the through holes, thus achieving the securing and separating of the substrate. It is possible to avoid the problem in prior art that when separating the substrate, due to different heights of the probes supporting the substrate separately, stress concentration would occur on the substrate at a location where a probe of higher height supports; the generation of uneven points on the substrate is depressed, thus improving the yield rate of the substrate. At the same time, the multiple probes are evenly distributed on the securing surface and have identical heights, therefore, it is possible to enlarge the contact area with the substrate when securing the same, so that the substrate can be secured firmly and the falling off rate of the substrate is reduced.

It should be understood that the substrate retaining carrier provided by the present disclosure is suitable not only for the securing and separating of the AMOLED glass substrate, but also for the securing and separating of the substrates made from other materials; the method for retaining and separating the substrate provided by the present disclosure is suitable not only for the evaporation technique of the substrate, but also for other procedures to secure and separate the substrates.

The above are only exemplary embodiments of the present invention, rather than limiting the protection reach of the present invention, the protection reach of the present invention is determined by the attached claims.

The present application claims the priority of the Chinese patent application No. 201510729440.5 filed on Oct. 30, 2015, the entirety of which is incorporated herein by reference as a part of the present application.

What is claimed is:

1. A substrate retaining carrier, comprising:
a substrate stage and a movable substrate retaining support device, wherein the substrate retaining support device comprises multiple probes, a probe holder, and a probe support device, wherein
a first end of each of the probes is provided with a substrate retaining member, and a second end of each of the probes is secured onto the probe holder;
the substrate stage is provided with through holes for passage of the probes therein;
the probe support device comprises: an elastic part for supporting the probe holder; and a support base for securing the elastic part;
the elastic part is located at a side of the probe holder opposite to the probes: and
the substrate retaining member comprises an adhesive gasket and a vacuum chuck, wherein a vacuum piping is further provided inside a corresponding probe of the multiple probes and coupled with the vacuum chuck.

2. The substrate retaining carrier according to claim 1, wherein each of the probes has a height greater than a thickness of the substrate stage.

3. The substrate retaining carrier according to claim 1, wherein the substrate retaining support device is configured to enable the first end of each of the probes to move into a corresponding through hole and locate between two surfaces of the substrate stage.

4. The substrate retaining carrier according to claim 1, wherein
the probe support device is configured to support the probes of the substrate retaining support device to reciprocate within the through holes.

5. The substrate retaining carrier according to claim 1, wherein the support base and the substrate stage are fixedly connected to each other.

6. The substrate retaining carrier according to claim 1, wherein the substrate stage comprises a substrate carrying surface, the probe holder and the probe support device are located at a side of the substrate stage opposite to the substrate carrying surface.

7. The substrate retaining carrier according to claim 6, wherein the elastic part is configured to drive the probe holder so that the probes reciprocate between a first position, at which the first end of each of the probes protrudes from the substrate carrying surface outside of the through holes, and a second position, at which the first end of each of the probes retracts into the through holes.

8. The substrate retaining carrier according to claim 1, wherein the second ends of the multiple probes are evenly secured onto the probe holder.

9. The substrate retaining carrier according to claim 1, wherein the multiple probes have identical heights.

10. A method for retaining and separating substrates, applied to the substrate retaining carrier according to claim 1, and comprising:
moving the first end of each of the probes to be above a surface of the substrate stage;
placing a substrate so that the substrate is secured onto the substrate retaining support device;
subjecting the substrate to vacuum adsorption to enhance an adhering capability between the substrate and the substrate retaining support device; and
after the vacuum adsorbing is stopped, moving the first end of each of the probes to be below the surface of the substrate stage, so as to separate the substrate from the substrate retaining support device.

11. A method for evaporation using a substrate retaining carrier which comprises: a substrate stage and a movable substrate retaining support device, wherein the substrate retaining support device comprises multiple probes and a probe holder, wherein a first end of each of the probes is provided with a substrate retaining member, and a second end of each of the probes is secured onto the probe holder; and the substrate stage is provided with through holes for passage of the probes therein,
the method comprising:
moving the first end of each of the probes to be above a surface of the substrate stage;
placing a substrate so that the substrate is secured onto the substrate retaining support device;
overturning the substrate retaining carrier and coating a film on the substrate;
overturning the substrate retaining carrier; and
moving the first end of each of the probes to be below the surface of the substrate stage, so as to separate the substrate from the substrate retaining support device.

* * * * *